United States Patent
Chae et al.

(10) Patent No.: US 7,397,316 B2
(45) Date of Patent: Jul. 8, 2008

(54) RING OSCILLATOR FOR CALIBRATING PHASE ERROR AND PHASE-ERROR CALIBRATION METHOD THEREFOR

(75) Inventors: Hyun-su Chae, Seoul (KR); Hoon-tae Kim, Yongin-si (KR); Jung-eun Lee, Seongnam-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 81 days.

(21) Appl. No.: 11/342,611

(22) Filed: Jan. 31, 2006

(65) Prior Publication Data

US 2006/0181357 A1    Aug. 17, 2006

(30) Foreign Application Priority Data

Feb. 14, 2005    (KR)    ........................ 10-2005-0012022

(51) Int. Cl.
*H03K 3/03*    (2006.01)
*H03B 27/00*    (2006.01)

(52) U.S. Cl. .............................. 331/57; 331/34; 331/45; 331/135; 331/177 R

(58) Field of Classification Search .................... 331/57, 331/34, 45, 60, 135, 177 R, 185
See application file for complete search history.

(56) References Cited

U.S. PATENT DOCUMENTS

| 5,180,994 A * | 1/1993 | Martin et al. .................. 331/38 |
| 6,549,082 B2 * | 4/2003 | Ipek et al. ..................... 331/57 |
| 2004/0179485 A1 * | 9/2004 | Terrier ......................... 370/310 |

* cited by examiner

*Primary Examiner*—Robert J. Pascal
*Assistant Examiner*—Ryan J Johnson
(74) *Attorney, Agent, or Firm*—Sughrue Mion, PLLC

(57) ABSTRACT

A ring oscillator and a phase error calibration method are provided. The ring oscillator may include a first voltage-current converter for controlling and outputting an amount of tail current Itail according to a magnitude of a first control voltage applied in feedback in a PLL circuit; a second voltage-current converter for controlling and outputting an amount of shift current according to a magnitude of a second control voltage applied from a system phase error detector; and differential amplifiers for controlling, for output signals, a delay time of signals based on the applied tail current amount and a shift time of the signals based on the shift current amount. Thus, a phase relation between in-phase and quadrature-phase signals outputted from the ring oscillator may be controlled.

12 Claims, 6 Drawing Sheets

RING OSCILLATOR FOR CALIBRATING PHASE ERROR AND PHASE-ERROR CALIBRATION METHOD THEREFOR

CROSS-REFERENCE TO RELATED APPLICATIONS

This application claims priority from Korean Patent Application No. 10-2005-0012022, filed on Feb. 14, 2005, the entire content of which is incorporated herein by reference.

BACKGROUND OF THE INVENTION

1. Field of the Invention

Apparatuses and methods consistent with the present invention relate to a ring oscillator for calibrating a phase error between in-phase and quadrature-phase signals occurring in wireless communication systems and a phase-error calibration method therefor.

2. Description of the Related Art

In general, communication systems may carry and send data on both an in-phase channel (I-channel) and a quadrature-phase channel (Q-channel). Thus, such communication systems require both in-phase and quadrature-phase oscillation signals having a 90° phase difference therebetween in order to completely restore a desired signal.

Such oscillation signals are used as input signals to a down-converter for converting a signal down to a lower frequency band at a signal-receiving stage, and used as input signals to an up-converter for converting a signal up to a higher frequency band at a signal-transmitting stage. If the in-phase oscillation signal and the quadrature-phase oscillation signal do not form an exact 90° phase difference therebetween, the Bit Error Rate (BER) may become high when a signal is completely restored, so it is critical to generate signals having an exact phase difference therebetween.

In particular, a direct conversion receiver (DCR) that separates signals into both channels at high frequencies more severely exhibits the effect of I/Q phase mismatch. Thus, a phase error occurring between oscillation signals on both channels should be eliminated for precise operation of signal transmitters and receivers.

The methods for generating oscillation signals having a 90° phase difference therebetween may include the method (in a structure developed by Athena Semiconductors, Inc.) that uses a butterfly structure for calibrating a phase error of I/Q signals in a digital signal region and the method that uses Poly Phase Filters (PPFs) for calibrating a phase error of I/Q signals in an analog signal region.

The former structure of Athena Semiconductors, Inc. is for a method that measures the power of in-phase and quadrature-phase signals in order to determine an Rx gain error and measuring correlation of the in-phase and quadrature-phase signals in order to determine the Rx phase error, so as to calibrate the phase error, which has an advantage in that the butterfly structure can be used to calibrate the phase error of in-phase and quadrature-phase signals as well as a gain error.

The latter method does not need any extra circuits for calibrating the error of the in-phase and quadrature-phase signals, and can tune a phase in a wide range.

However, despite such advantages, the former structure of Athena Semiconductors, Inc. has a disadvantage due to calibration difficulties, long processing time due to complicated digital processing if the phase error of the in-phase and quadrature-phase signals becomes large, and requires the assumption that Rx calibrations are accomplished when the Tx calibrations are supposed to be perfect. Meanwhile, the latter method also has a problem in that it cannot be applied to systems that do not use PPFs.

SUMMARY OF THE INVENTION

The present invention has been developed in order to solve the above drawbacks and other problems associated with the conventional arrangement. An aspect of the present invention provides a phase-error calibration method for phase locked loop (PLL) circuits and ring oscillators capable of controlling tail and shift current amounts to calibrate a phase error of output signals.

The foregoing and other aspects are substantially realized by providing a ring oscillator, comprising a first voltage-current converter that controls and outputs an amount of a tail current according to a magnitude of a first control voltage that is applied in feedback in a PLL circuit; a second voltage-current converter that controls and outputs an amount of a shift current according to a magnitude of a second control voltage that is applied from a system phase error detector; and a plurality of differential amplifiers that control, for output signals, a delay time of the output signals based on the amount of the tail current that is output by the first voltage-current converter and a shift time of the output signals based on the amount of the shift current that is output by the second voltage-current converter.

The system phase error detector may be a modem.

The differential amplifiers may include a first differential amplifier, a second differential amplifier, a third differential amplifier, and a fourth differential amplifier, and an input of the first differential amplifier of a first stage is connected in a ring configuration to an output of the fourth differential amplifier of a final stage.

The second differential amplifier may output a positive and negative in-phase signal, and the fourth differential amplifier outputs a positive and negative quadrature-phase signal.

The first differential amplifier may output an in-phase signal having positive and negative polarity, and the third differential amplifier outputs a quadrature-phase signal having positive and negative polarity.

The delay time may be a sum of first to fourth delay times that are each delayed according to the tail current that is applied to the first to fourth differential amplifiers.

The shift time may be a sum of first to fourth shift times that are each shifted according to the amount of the shift current that is applied to the first and fourth differential amplifiers.

The first and second shift times may have equal magnitude and positive polarization, and the third and fourth shift times may have equal magnitude and negative polarization.

Alternatively, the first and second shift times may have equal magnitude and negative polarization, and the third and fourth shift times may have equal magnitude and positive polarization.

The sum of the first to fourth delay times and the sum of the first to fourth shift times may be constant.

According to another aspect, a method for calibrating a phase error of an output signal of a ring oscillator is provided which comprises controlling an amount of a tail current, and generating a constant frequency according to a magnitude of a first control voltage that is applied from a phase-locked loop; controlling and applying an amount of a shift current according to a magnitude of a second control voltage that is applied from a system phase error detector; and controlling and outputting a delay time at each end of the ring oscillator based on the amount of the shift current that is applied.

The delay time at each end of the ring oscillator may be controlled according to the second control voltage such that a sum of first to fourth delay times of first to fourth differential amplifiers, respectively, which are connected in a ring configuration, is constant and only a phase difference between in-phase and quadrature-phase signals is controlled.

BRIEF DESCRIPTION OF THE DRAWINGS

The above and other aspects of the present invention will become more apparent by describing certain exemplary embodiments of the present invention with reference to the accompanying drawings, in which.

DETAILED DESCRIPTION OF THE EXEMPLARY EMBODIMENTS OF THE PRESENT INVENTION

Hereinafter, the exemplary embodiments of the present invention will be described in detail with reference to the accompanying drawings. However, well-known functions and structures related to the present invention that unnecessarily distract from the description of the exemplary embodiments of the present invention will be omitted.

Figure 1:
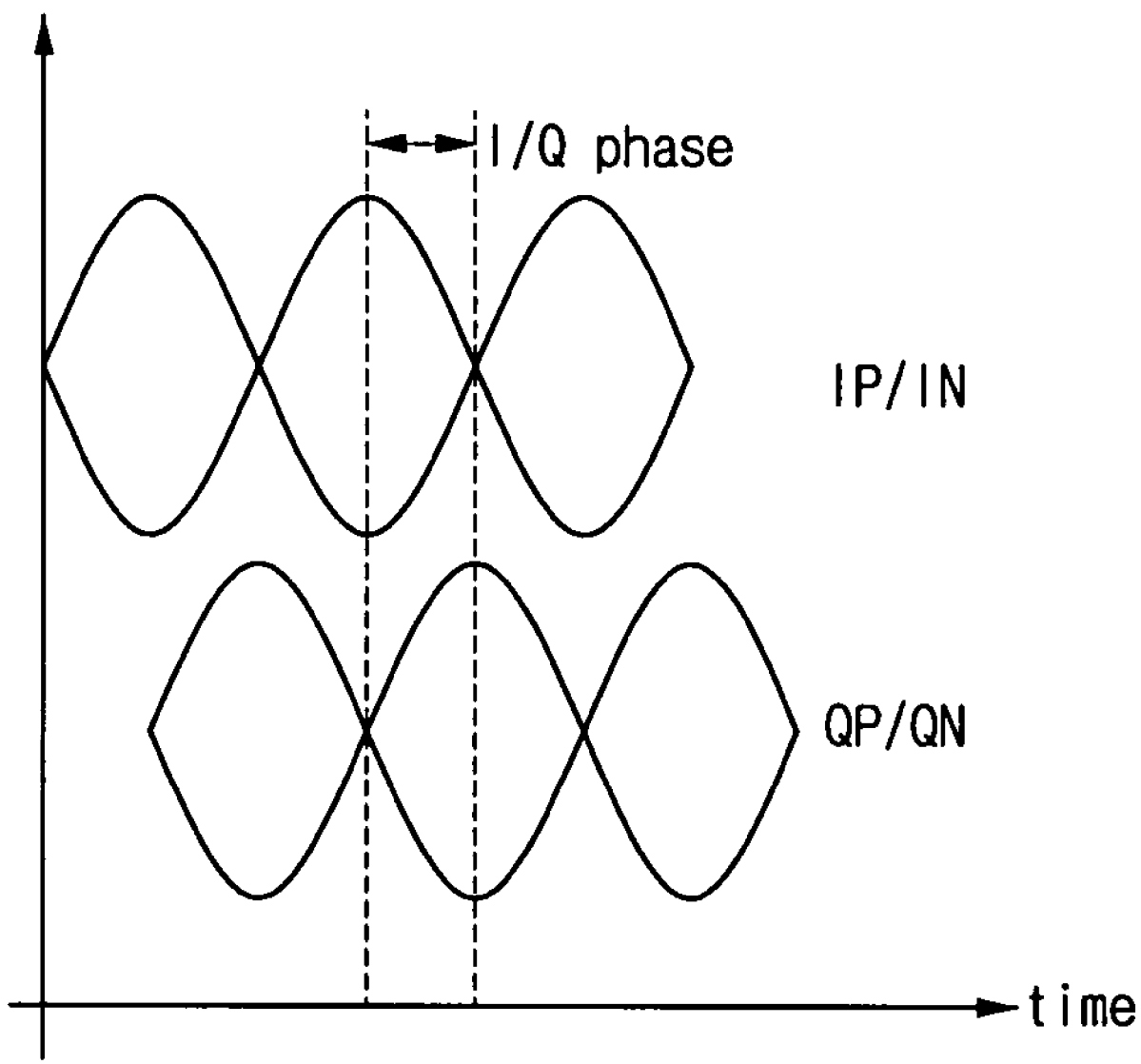
FIG. 1 is a graph for showing an ideal phase difference between an in-phase signal and a quadrature-phase signal.
Figure 2:
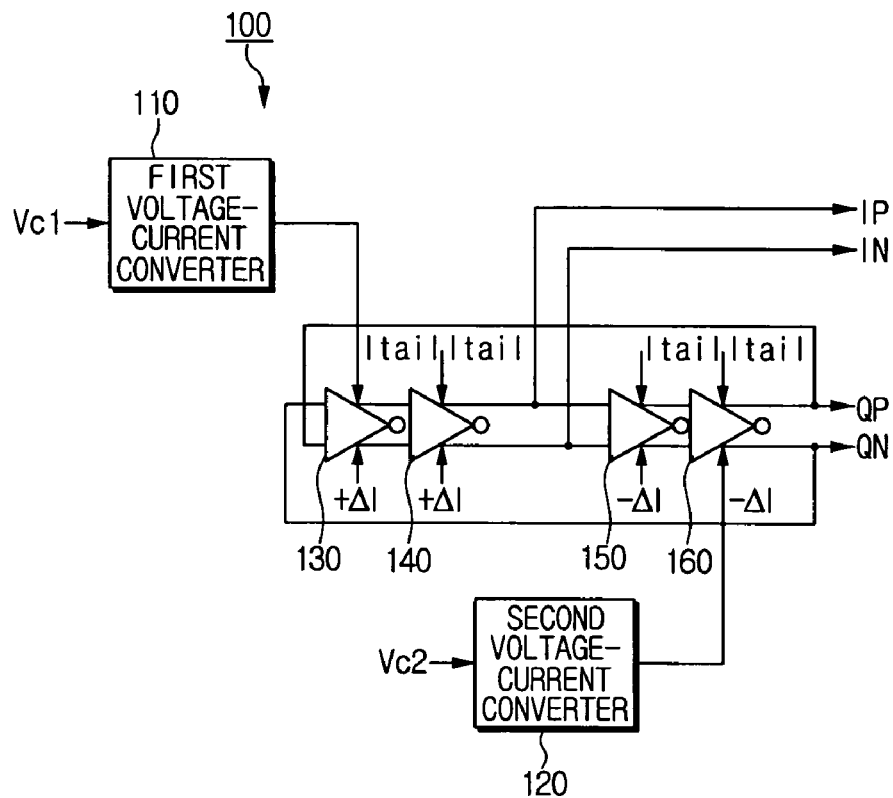
FIG. 2 is a circuit diagram for showing a ring oscillator according to an exemplary embodiment of the present invention.

FIG. 1 is a graph for showing an ideal phase difference of in-phase and quadrature-phase signals, and FIG. 2 is a view for showing a ring oscillator according to an exemplary embodiment of the present invention.

In FIG. 1, there exists a phase difference of 180° between the in-phase positive (IP) signal and the in-phase negative (IN) signal produces a phase difference of 180°, and there exists a phase difference of 180° between the quadrature-phase positive (QP) signal and the quadrature-phase (QN) negative signal as well. Here, in the case of a digital system, a system phase error detector is exemplified as a modem. However, the scope of the present application is not intended to be limited to such an exemplary embodiment.

The phase differences between IP and QP signals and IN and QN signals, indicated in a double-head arrow, each have a value very close to 90°, but, in order to calibrate an I/Q phase error occurring in wireless communication transmitters and receivers using a ring oscillator 100, a voltage signal that provides notification of a phase error amount is inputted from a modem, and a phase difference between IP/QP signals or the IN/QN signals of the ring oscillator 100 is forced to change to 90°.

In FIG. 2, the ring oscillator 100 has a first voltage-current converter 110, a second voltage-current converter 120, and first to fourth differential amplifiers 130, 140, 150, and 160.

The first voltage-current converter 110 converts a first control voltage Vc1 applied from a phase locked loop (PLL) into tail current Itail.

The PLL is used to synchronize an internal clock signal with an external clock signal in terms of phase when the system externally receives the external clock signal and generates the internal clock signal necessary for its operations.

An amount of the tail current Itail determines frequencies of output signals of the first to fourth differential amplifiers 130, 140, 150, and 160, that is, if the amount of the tail current Itail decreases, the frequencies of the output signals of the first to fourth differential amplifiers 130, 140, 150, and 160 decrease, and, if the amount of the tail current Itail increases, the frequencies of the output signals of the first to fourth differential amplifiers 130, 140, 150, and 160 increase1.

According to the designs of a ring oscillator, the amount of the tail current Itail is in inverse proportion to the frequencies of the output signals.

The second voltage-current converter 120 converts a second control voltage applied from a modem (not shown) in order to provide a shift current ±ΔI.

The modem is a device used to connect devices for data communications such as computers, terminals, or the like to communication lines for data communications, which is a modulation/demodulation device that combines a modulator and a demodulator. The modem is needed to connect digital and analog signals since the digital signals in the data communication device and the analog signals flowing in communication lines have a different signal format from each other.

The first to fourth differential amplifiers 130, 140, 150, and 160 are connected in series together, such that an input to the first differential amplifier 130 of the first stage is connected in a ring to form an output of the fourth differential amplifier 160 of the final stage.

In such a structure, plural signals IP, IN, QP, and QN are generated, which have certain phase differences through the first to fourth differential amplifiers 130, 140, 150, and 160 that comprise the ring oscillator 100.

In generating plural signals, as shown in FIG. 2, the IP/IN signals are outputted from the second differential amplifier 140, and the QP/QN signals are outputted from the fourth differential amplifier 160. In accordance with another exemplary embodiment, the IP/IN signals may be outputted from the first differential amplifier 130 and the QP/QN signals are outputted from the third differential amplifier 150.

The ring oscillator 100 is basically a circuit for oscillation which is built with plural inverter circuits in a positive-feedback loop, and the single-ended ring oscillator needs an odd number of stages to build an oscillation loop, but the ring oscillator 100 of a differential structure as in the structure according to exemplary embodiments of the present invention may have an even number of stages.

Therefore, as shown in FIG. 2, exemplary embodiments of the present invention include the ring oscillator 100 built with four stages as well as the ring oscillator 100 built with the other even number of stages.

Figure 3:
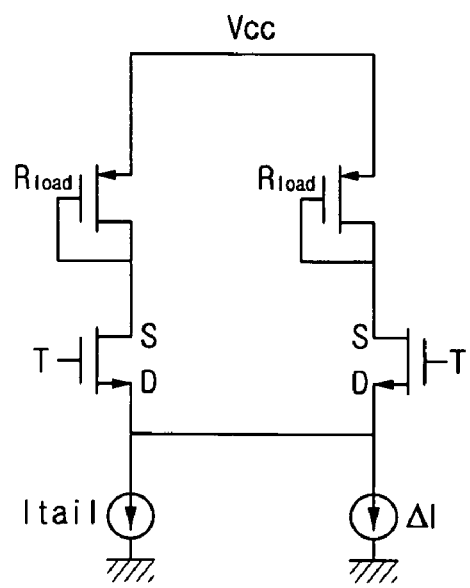
FIG. 3 is a circuit diagram for showing differential amplifiers that construct individual stages of the ring oscillator of FIG. 2.

FIG. 3 is a circuit diagram for showing differential amplifiers constructing individual stages of the ring oscillator of FIG. 2.

In FIG. 3, the source S of a transistor T is connected to the source S of another transistor T. The drain D of each transistor T is connected to a load resistor $R_{load}$. Further, the load resistor $R_{load}$ is connected to a power line Vcc.

The source S of the transistor T is connected to current Itail and to the ground GND. The source S of the other transistor T is connected to current ΔI and to the ground GND.

Further, the drain D of the transistor T is connected to the load resistor $R_{load}$ and to the power line Vcc, and a control voltage supplied through such a power line Vcc determines delay and shift signals of an output signal.

Figure 4:
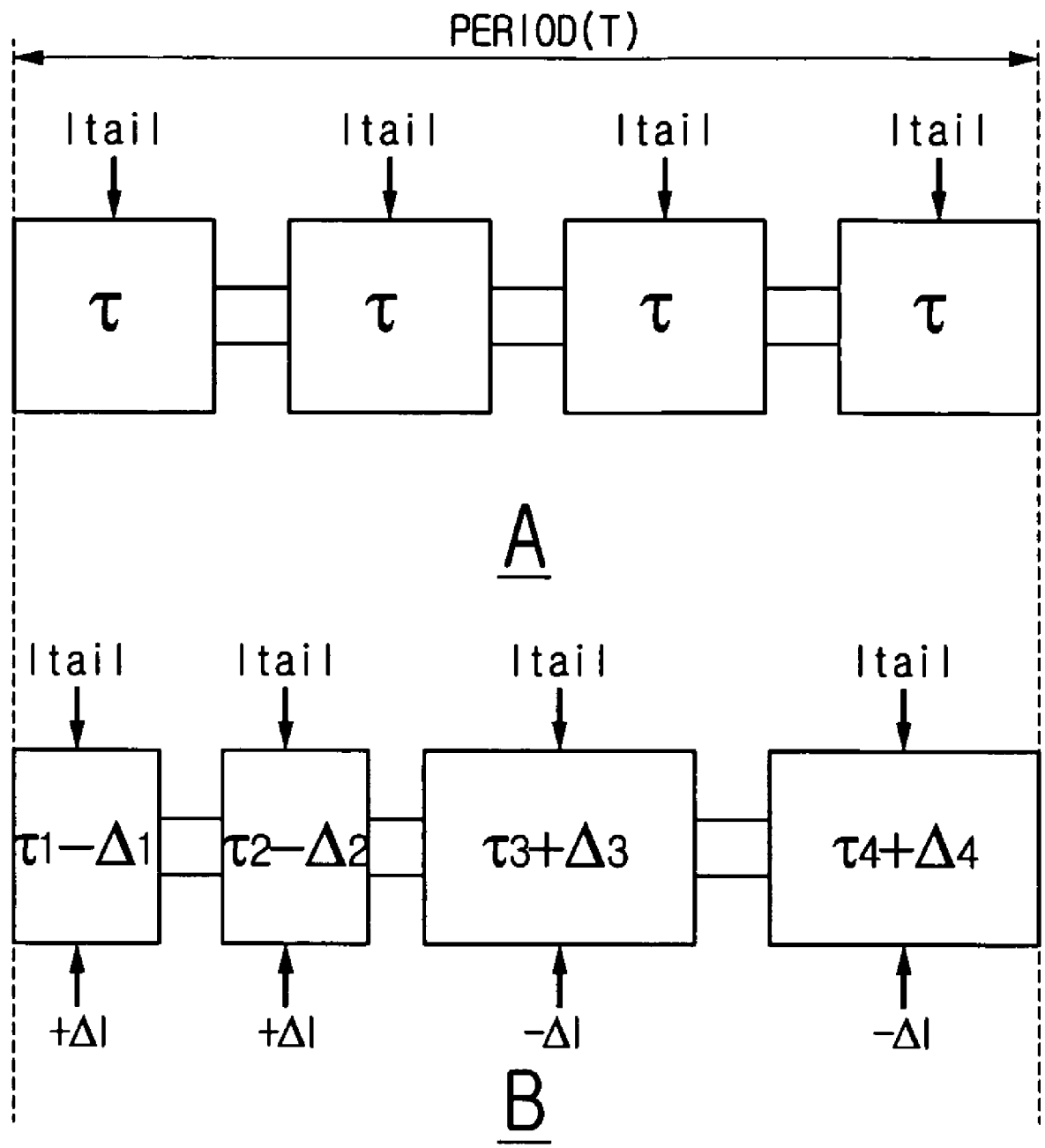
FIG. 4 is a view for conceptually showing delay and shift times that form one time period of an output signal.

FIG. 4 is a view for conceptually showing delay and shift times forming one time period of an output signal.

In FIGS. 2 and 4 and as denoted in A, in the general ring oscillator 100, one period T of an output signal is formed with a sum of delay times T in the individual stages, which are delayed only by the current Itail. The period T of the output signal outputted from the ring oscillator 100 is always constant in an ideal PLL circuit.

Therefore, one period T of an output signal outputted from the ring oscillator 100 according to an exemplary embodiment of the present invention is the same as a frequency of the output signal of the ring oscillator 100 that is controlled only by the general current Itail as above.

As denoted in B, one period T of the ring oscillator 100 is the same, but the different delay times are applied to the individual stages forming the ring oscillator 100.

That is, τ-Δ corresponds to a sum of the first delay time τ1 and the first shift time Δ1 or to a sum of the second delay time τ2 and the second shift time Δ2 caused by a current of +ΔI, which corresponds to a delay time of the stage of the first differential amplifier 130 and the stage of the second differential amplifier 140.

However, it is different from general occasions since τ-Δ corresponds to a sum of the third delay time τ3 and the third shift time Δ3 or to a sum of the fourth delay time τ4 and the fourth delay time Δ4 caused by the current of +ΔI, which corresponds to a delay time of the stage of the first differential amplifier 130 and the state of the second differential amplifier 140.

That is, while one period T of an output signal of the ring oscillator 100 is constantly maintained according to voltage Vc1 applied from the phase-locked loop, that is, while the PLL constantly maintains a frequency as its own function, the delay time of each stage is controlled so that a phase relation of the output signals is controlled according to ±ΔI, which is controlled by voltage Vc2 applied from the modem.

For example, the first shift time Δ1 and the second shift time Δ2 are identical and in the positive sign, and the third shift time Δ3 and the fourth shift time Δ4 are identical and in the negative sign. However, Δ1 and the second shift time Δ2 may be identical and in the negative sign, and the third shift time Δ3 and the fourth shift time Δ4 may be identical and in the positive sign.

For example, if the shift current amounts of the first and second differential amplifiers 130 and 140 are increased by +ΔI, the stage delay times of the first and second differential amplifiers 130 and 140 are decreased by −Δ, and, if the shift current amounts of the third and fourth differential amplifiers 150 and 160 are decreased by −ΔI, the stage delay times of the third and fourth differential amplifiers 150 and 160 are increased by +Δ.

That is, the total delay time of the ring oscillator 100 can be constantly maintained so that the oscillation frequency is fixed, and can change a shift current amount so that a phase value of in-phase and quadrature-phase signals can be controlled.

Figure 5:
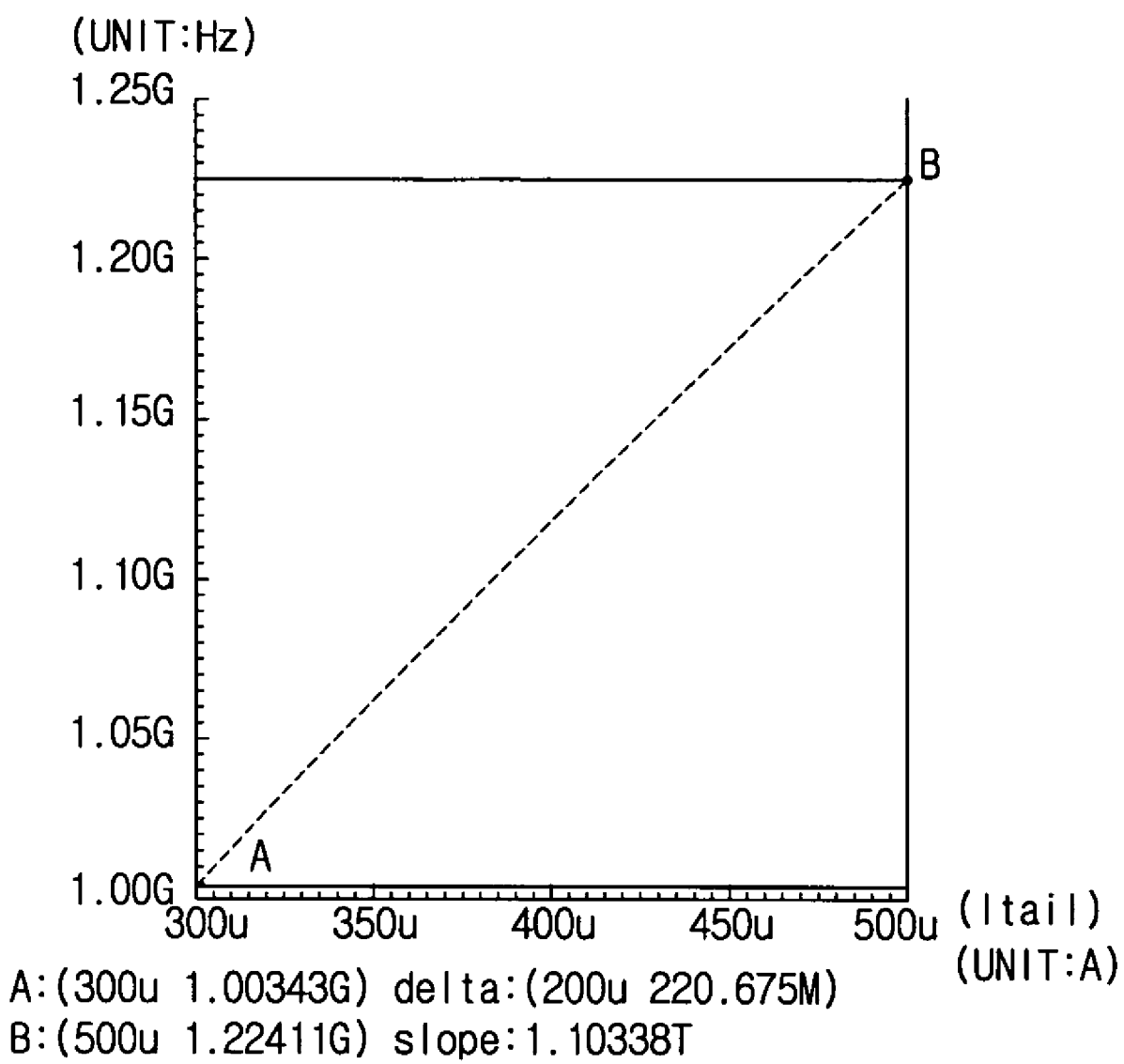
FIG. 5 is a graph for showing frequencies of an output signal varying with tail current amounts controlled according to an exemplary embodiment of the present invention.
Figure 6:
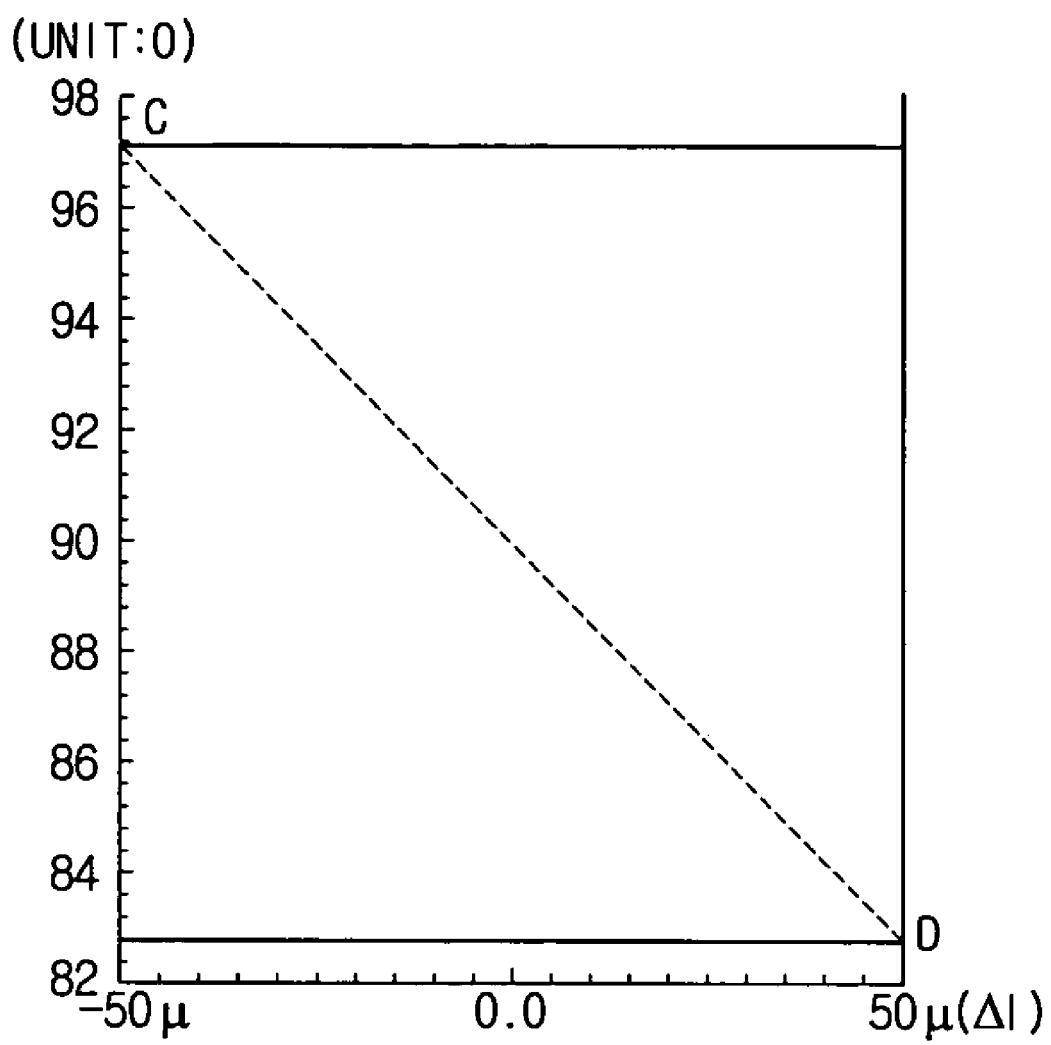
FIG. 6 is a graph for showing phase differences of an output signal varying with shift current amounts controlled according to an exemplary embodiment of the present invention.

FIG. 5 is a graph for showing frequencies of an output signal varying with tail current amounts controlled according to an exemplary embodiment of the present invention, and FIG. 6 is a graph for showing phase differences of an output signal varying with shift current amounts controlled according to an exemplary embodiment of the present invention.

FIG. 5 shows that frequencies change in proportion to the amounts of the tail current Itail.

The PLL is used to synchronize the phase of an internal clock signal with the phase of an external clock signal when externally receiving an external clock signal outside the system and generating an internal clock signal necessary for operations inside of the system.

Therefore, in view of the functions of the PLL, the frequencies may change in proportion to the amount of the tail current Itail, and, according to an exemplary embodiment of the present invention, even though +ΔI and −ΔI are inputted from a modem, the frequencies may change in proportion to the amount of the tail current Itail regardless of the inputs.

Meanwhile, in FIGS. 2 and 6, +ΔI and −ΔI are applied from the modem and converted change an output signal. That is, a phase relation between the IP/QP or the IN/QN, and the phase values shown in FIG. 6 can be relative values, which can be described in detail as below.

For example, the voltage Vc2 that is applied to the second voltage-current converter 120 is controlled in order that a shift current of as much as 50 μA corresponding to +ΔI is applied to the first and second differential amplifiers 130 and 140, and the voltage Vc2 applied to the second voltage-current converter 120 is controlled in order that a shift current of as much as −50 μA corresponding to −ΔI is applied to the third and fourth differential amplifiers 150 and 160. As shown in FIG. 6, the shift current amount is 0 μA if there is no phase error between in-phase and quadrature-phase signals occurring in wireless communication systems. If the in-phase signal comes ahead or behind to calibrate a phase error that occurs in a system, the phase error is calibrated as a shift current amount at a point at which a minimized phase error is supplied, while changing the shift current amounts. If a shift current of 50 μA is applied to the first and second differential amplifiers 130 and 140 and a shift current of −50 μA is applied to the third and fourth differential amplifiers 150 and 160, the in-phase signals of an output signal 97.2° corresponding to a reference numeral C and quadrature-phase signals of an output signal are 82.8° corresponding to a reference numeral D.

In response to a shift current of +ΔI applied to the first and second differential amplifiers 130 and 140 and a shift current of −ΔI applied to the third and fourth differential amplifiers 150 and 160, a value for calibrating a phase error of the output signals of the first and second differential amplifiers 130 and 140 will have almost the same absolute value but opposite in polarity to a value for calibrating a phase error of the output signals of the third and fourth differential amplifiers 150 and 160.

In addition to reference numerals C and D, which are provided for the purpose of convenient explanation, it can be seen that the phase error of in-phase and quadrature-phase signals is calibrated to approximately 90° for one period, as above, even though currents of different polarity +ΔI and −ΔI are applied to the first and second differential amplifiers 130 and 140 and the third and fourth differential amplifiers 150 and 160, respectively.

Figure 7:
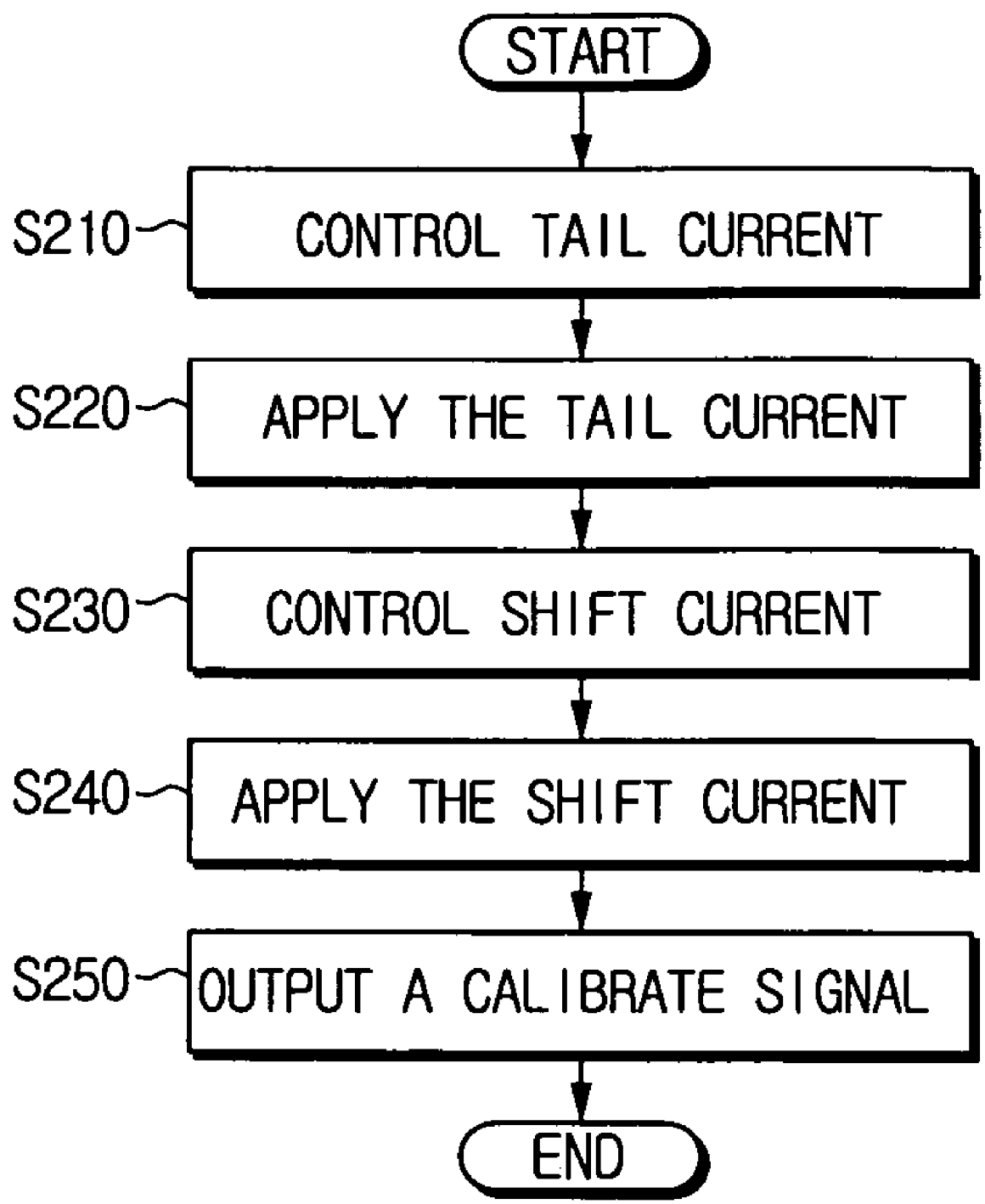
FIG. 7 is a flow chart for showing a phase calibration method for a ring oscillator according to an exemplary embodiment of the present invention.

FIG. 7 is a flow chart for showing a phase calibration method for ring oscillators according to an exemplary embodiment of the present invention.

In FIG. 2 and FIG. 7, the voltage Vc1 from the PLL is applied to the first voltage-current converter 110, while being controlled, and the controlled Vc1 controls an amount of the current Itail (S210).

Next, the controlled current Itail is applied to the first to fourth differential amplifiers 130, 140, 150, and 160 (S220).

The voltage Vc2 corresponding to an amount of a phase error occurring in the system is provided from the modem, and the voltage Vc2 is applied to the second voltage-current converter 120, while being controlled and applied, and the applied voltage Vc2 is generated as an amount of the current ±ΔI (S230).

Further, the controlled current of +ΔI is applied to the first to fourth differential amplifiers 130, 140, 150, and 160 (S240).

The amount of the applied tail current Itail controls a delay time of an output signal and a shift time of the signal according to the amount of the shift current of ΔI, that is, a phase error-calibrated signal of the output signal is outputted (S250).

The above method calibrates a phase error of an output signal of the ring oscillator 100 so that transmitters and receivers can perform precise operations for communications.

As aforementioned, the present method precisely calibrates a phase difference between phases of in-phase and quadrature-phase signals to 90° through a separate control voltage, while maintaining the frequencies of an output signal of the ring oscillator to proportionally vary with the control voltage, so as to enable transmitters and receivers to precisely operate for communications.

The foregoing embodiments and advantages are merely exemplary and are not to be construed as limiting the present invention. The present teaching can be readily applied to other types of apparatuses. Also, the description of the exemplary embodiments of the present invention is intended to be illustrative, and not to limit the scope of the claims, and many alternatives, modifications, and variations will be apparent to those skilled in the art.

What is claimed is:

1. A ring oscillator, comprising:
   a first voltage-current converter that controls and outputs an amount of a tail current according to a magnitude of a first control voltage that is applied in feedback in a phase locked loop (PLL) circuit;
   a second voltage-current converter that controls and outputs an amount of a shift current according to a magnitude of a second control voltage that is applied from a system phase error detector; and
   a plurality of differential amplifiers that control, for output signals, a delay time of the output signals based on a value corresponding to the amount of the tail current that is output by the first voltage-current converter and a shift time of the output signals based on a value corresponding to the amount of the shift current that is output by the second voltage-current converter.

2. The ring oscillator as claimed in claim 1, wherein the system phase error detector is a modem.

3. The ring oscillator as claimed in claim 1, wherein the differential amplifiers include a first differential amplifier, a second differential amplifier, a third differential amplifier, and a fourth differential amplifier, and an input of the first differential amplifier of a first stage is connected in a ring configuration to an output of the fourth differential amplifier of a final stage.

4. The ring oscillator as claimed in claim 3, wherein the second differential amplifier outputs a positive and negative in-phase signal, and the fourth differential amplifier outputs a positive and negative quadrature-phase signal.

5. The ring oscillator as claimed in claim 3, wherein the first differential amplifier outputs an in-phase signal having positive and negative polarity, and the third differential amplifier outputs a quadrature-phase signal having positive and negative polarity.

6. The ring oscillator as claimed in claim 3, wherein the delay time is a sum of first to fourth delay times that are each delayed according to the amount of the tail current that is applied to the first to fourth differential amplifiers.

7. The ring oscillator as claimed in claim 6, wherein the shift time is a sum of first to fourth shift times that are each shifted according to the amount of the shift current that is applied to the first and fourth differential amplifiers.

8. The ring oscillator as claimed in claim 7, wherein the first and second shift times have equal magnitude and positive polarization, and the third and fourth shift times have equal magnitude and negative polarization.

9. The ring oscillator as claimed in claim 7, wherein the first and second shift times have equal magnitude and negative polarization, and the third and fourth shift times have equal magnitude and positive polarization.

10. The ring oscillator as claimed in claim 7, wherein the sum of the first to fourth delay times and the sum of the first to fourth shift times are constant.

11. A method for calibrating a phase error of an output signal of a ring oscillator, the method comprising:
    controlling an amount of a tail current, and generating a constant frequency according to a magnitude of a first control voltage that is applied from a phase-locked loop;
    controlling and applying an amount of a shift current according to a magnitude of a second control voltage that is applied from a system phase error detector; and
    controlling and outputting a delay time at each end of the ring oscillator based on the amount of shift current that is applied.

12. The method as claimed in claim 11, wherein the delay time at each end of the ring oscillator is controlled according to the second control voltage such that a sum of first to fourth delay times of first to fourth differential amplifiers, respectively, which are connected in a ring configuration, is constant and only a phase difference between in-phase and quadrature-phase signals is controlled.

* * * * *